(12) United States Patent
McDowell et al.

(10) Patent No.: US 7,446,550 B2
(45) Date of Patent: Nov. 4, 2008

(54) ENHANCED SIGNAL OBSERVABILITY FOR CIRCUIT ANALYSIS

(75) Inventors: Chandler Todd McDowell, Austin, TX (US); Stanislav Polonsky, Putnam Valley, NY (US); Peilin Song, Lagrangeville, NY (US); Franco Stellari, Ho Ho Kus, NJ (US); Alan J. Weger, Mohegan Lake, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/949,325

(22) Filed: Dec. 3, 2007

(65) Prior Publication Data

US 2008/0079448 A1     Apr. 3, 2008

Related U.S. Application Data

(63) Continuation of application No. 10/912,493, filed on Aug. 5, 2004, now Pat. No. 7,355,419.

(51) Int. Cl.
*G01R 31/02* (2006.01)

(52) U.S. Cl. .................. 324/763; 324/770; 324/158.1

(58) Field of Classification Search ................ 324/763, 324/158.1, 770
See application file for complete search history.

(56) References Cited

U.S. PATENT DOCUMENTS

| 5,043,584 | A | 8/1991 | Koishi |
| 5,175,495 | A | 12/1992 | Brahme et al. |
| 5,812,191 | A * | 9/1998 | Orava et al. ............. 348/308 |
| 6,628,126 | B2 * | 9/2003 | Allen ....................... 324/753 |
| 6,891,363 | B2 | 5/2005 | Desplats et al. |
| 7,039,884 | B2 * | 5/2006 | Kitchin ...................... 716/4 |
| 7,057,182 | B2 | 6/2006 | Kitchin |
| 7,057,409 | B2 * | 6/2006 | Wills ........................ 324/763 |
| 2002/0190735 | A1 | 12/2002 | Allen |
| 2005/0094866 | A1 * | 5/2005 | Castelino et al. .......... 382/149 |

OTHER PUBLICATIONS

Tsang, J.C.; Kash, J.A.; and Vallet, D.P., "Picosecond imaging circuit analysis", IBM J. Res. Develop., v44, n4, (Jul. 2000) pp. 583-603.
Stellari, F., P. Song, J.C. Tsang, M.K. McManus, M.B. Ketchen, Optical diagnosis of excess IDDQ in low power CMOS circuits, Microelectronics Reliability v.42, issue 9-11, (2002), pp. 1689-1694.

* cited by examiner

*Primary Examiner*—Ha Nguyen
*Assistant Examiner*—Richard Isla Rodas
(74) *Attorney, Agent, or Firm*—Casimer K. Salys; Schubert Osterrieder & Nickelson PLLC (57) ABSTRACT

Methods and arrangements to enhance photon emissions responsive to a signal within an integrated circuit (IC) for observability of signal states utilizing, e.g., picosecond imaging circuit analysis (PICA), are disclosed. Embodiments attach a beacon to the signal of interest and apply a voltage across the beacon to enhance photon emissions responsive to the signal of interest. The voltage is greater than the operable circuit voltage, Vdd, to enhance photon emissions with respect to intensity and energy. Thus, the photon emissions are more distinguishable from noise. In many embodiments, the beacon includes a transistor and, in several embodiments, the beacon includes an enablement device to enable and disable photon emissions from the beacon. Further, a PICA detector may capture photon emissions from the beacon and process the photons to generate time traces.

14 Claims, 5 Drawing Sheets

ENHANCED SIGNAL OBSERVABILITY FOR CIRCUIT ANALYSIS

CROSS-REFERENCE TO RELATED APPLICATION

This application is a continuation application of U.S. patent application Ser. No. 10/912,493, entitled "ENHANCED SIGNAL OBSERVABILITY FOR CIRCUIT ANALYSIS", filed Aug. 5, 2004, now U.S. Pat. No. 7,355,419 the disclosure of which is incorporated herein in its entirety for all purposes.

FIELD OF INVENTION

The present invention is in the field of electrical circuits. More particularly, the present invention relates to methods and arrangements to enhance photon emissions responsive to a signal to enhance observability of the signal for circuit analysis.

BACKGROUND

Often, integrated circuit (IC) designers and manufacturers measure voltages and currents deep inside an operating IC to analyze and repair operational faults. In particular, when a prototype IC is not performing up to specifications or an IC is returned from the field due to a failure, engineers test the faulty IC to determine the cause of the failure and take corrective measures to avoid the problem in subsequently produced ICs. Two classic probing techniques involved: accessing exposed conductors with external physical probes and probing with a focused electron beam. Both require access to the conductors in metallization layers of the IC. While early ICs had few metallization layers, eight metallization layers are not uncommon in contemporary designs. As a result, the classic techniques require invasive and destructive processes to provide access to the conductors that risk compromising the accuracy of the measurement.

To avoid these problems, an optical probing technique developed to non-invasively measure and debug electrical activity of an IC. The technique is generally known as picosecond imaging circuit analysis (PICA). PICA captures emissions of photons produced by carriers traversing through an electric field between high and low voltages. The intensity of the photon emissions is linearly related to the current. More specifically, the voltage difference between the ends of the channel, e.g., the drain and source, of a field effect transistor subjects carriers in the channel to an acceleration force that increases the kinetic energy of the carriers. Most carriers collide into other carriers, substantially reducing the carriers' kinetic energy upon reaching the other end of the channel. However, carriers that encounter very little impedance while traversing the channel may attain a kinetic energy that exceeds the bandgap energy for the channel, e.g., silicon. As a result, the carrier may release a photon, which can escape the IC.

Several current trends in IC design have reduced the foreseeable viability of PICA. Current IC designs often implement Complementary Metal Oxide Semiconductor (CMOS) circuitry to reduce power consumption by ICs. The tendency to move toward CMOS has reduced the currents in conventional ICs. In particular, CMOS circuits are designed to draw current only during switching activities. Thus, most photons are released while components of the CMOS circuits are switching from one state to another.

Further, designers continually try to reduce the size while increasing the speed of the ICs. The trend is to reduce the size of each component of the ICs, which also requires that the operable circuit voltage, Vdd, has reduced over generations of IC designs. The problem is that the reduction in Vdd reduces the average excess in kinetic energy over the bandgap energy, which, in turn, makes the photon emissions resulting from switching activities less distinguishable from normal thermal activities of the IC, often referred to as noise. The normal thermal activities include, for example, leakage currents.

Detectors designed to detect the photon emissions may include filters to exclude the noise. However, the relatively few numbers of photons released during an operation of the IC are currently inadequate for accurate analysis of circuit activities. Thus, multiple repetitions of the same circuit operations may be required to determine the problem with the faulty IC. It's not uncommon for a test to require 20 hours before sufficient data is recorded to analyze the problem.

PICA detectors are improving in sensitivity but have limited ability to detect high frequency signals. To probe states of high frequency signals with critical timing, like the clock, strong photon emissions are needed to be distinguishable with accuracy in captured imaged over time. As beneficial as PICA is to an integrated circuit debugging, the problem of low energy photon emissions make the benefits difficult to realize. Therefore, a new non-invasive analytic tool to measure the electrical activity of an integrated circuit having a low supply voltage is needed.

SUMMARY OF THE INVENTION

The problems identified above are in large part addressed by methods and arrangements to enhance photon emissions responsive to a signal of an operating integrated circuit. One embodiment provides an apparatus to enhance photon emissions responsive to a signal of an operating integrated circuit. The apparatus comprises circuitry of the operating integrated circuit, adapted to apply the signal to a conductor, wherein the signal has a magnitude at or less than at first supply voltage; and a transistor. The transistor has a channel coupled with a second supply voltage and a gate coupled with the conductor to accelerate carriers through the channel in response to the signal. Further, the second supply voltage is greater than the first supply voltage to generate the photon emissions via the carriers.

Another embodiment provides a system to non-invasively probe states of a signal within an operating integrated circuit. The system comprises an integrated circuit with circuitry adapted to apply the signal to a conductor. The signal has a magnitude at or less than a first supply voltage. The system also comprises a transistor having a channel coupled with a second supply voltage and having a gate coupled with the conductor to conduct current in response to a transition in the states of the signal. The second supply voltage is a greater than the first supply voltage to generate photon emissions via carriers of the current. Further, the system comprises a detector to capture the photon emissions and associate the photon emissions with time indices to monitor activity of the transistor. Such activity is indicative of the states of the signal.

A further embodiment provides a method to enhance photon emissions responsive to a signal of an integrated circuit. The method comprises applying the signal to a gate of a transistor. The signal has a magnitude at or less than a first supply voltage to conduct current through the channel in response to the signal. The method also comprises applying an electric field to a channel of the transistor. The voltage difference between the ends of the channel is greater than an operable circuit voltage for the integrated circuit to generate the photon emissions via carriers of the current.

BRIEF DESCRIPTION OF THE DRAWINGS

Other objects and advantages of the invention will become apparent upon reading the following detailed description and upon reference to the accompanying drawings in which, like references may indicate similar elements.

DETAILED DESCRIPTION OF EMBODIMENTS

Introduction

The following is a detailed description of embodiments of the invention depicted in the accompanying drawings. The embodiments are in such detail as to clearly communicate the invention. The amount of detail offered is not intended to limit the anticipated variations of embodiments; on the contrary, the intention is to cover all modifications, equivalents, and alternatives falling within the spirit and scope of the present invention as defined by the appended claims. The detailed descriptions below are designed to make such embodiments obvious to a person of ordinary skill in the art.

Methods and arrangements to enhance photon emissions responsive to a signal within an integrated circuit (IC) for observability of signal states utilizing, e.g., picosecond imaging circuit analysis (PICA), are disclosed. Embodiments attach a beacon to the signal of interest and apply a voltage across the beacon to enhance photon emissions responsive to the signal of interest. The voltage is greater than the operable circuit voltage, Vdd, to enhance photon emissions with respect to intensity and energy. Thus, the photon emissions are more distinguishable from noise.

The beacon may include, for example, a field effect transistor having a gate coupled with a conductor carrying the signal and having a channel coupled between a PICA supply voltage (Vpica) and a low circuit voltage such as a circuit ground. Vpica is a voltage that is greater in magnitude than the upper and lower bounds, or rails, of the signal and Vpica is designed to increase the electric field intensity applied to carriers in the channel. The carriers may be electrons for negative-channel FETs and holes for positive-channel FETs.

In many embodiments, the beacon includes an enablement device to enable and disable photon emissions from the transistor. The enablement device may be, for instance, another FET. Further, the enablement device is designed to compliment the transistor by maintaining a voltage drop across the transistor that is greater than the maximum magnitude of the signal of interest while the beacon is enabled.

In several embodiments, a PICA detector may capture photon emissions from the beacon. The detector may process the photons to generate time traces that associate transistor activity for beacons with time indices. Thus, by adding a beacon transistor that emits photons in correlation to an input signal, the photon emissions may be detected and processed to form time traces. Further, several embodiments collect multiple photon emissions from an area of the IC and identify the location of a beacon by matching patterns of photon emissions with known positions of transistors in the area.

DETAILED DESCRIPTION

Figure 1:
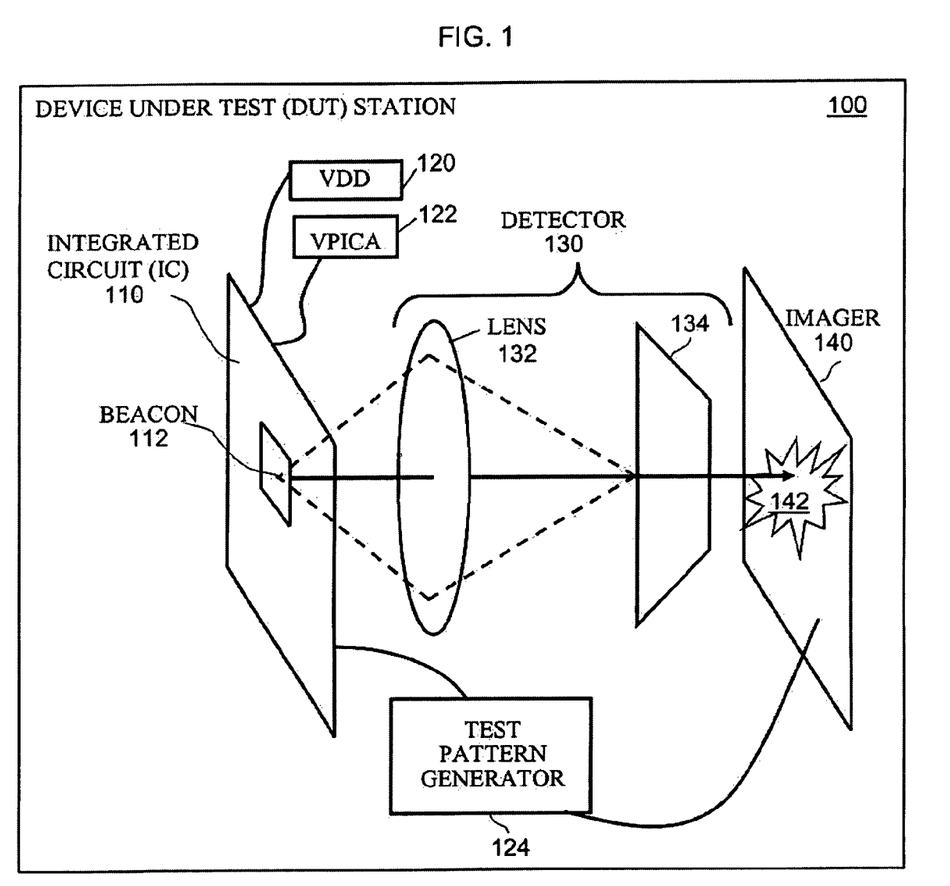
FIG. 1 depicts an embodiment of a system to observe the state of signals within an integrated circuit to generate enhanced photon emissions.

Turning now to the drawings, FIG. 1 depicts an embodiment of a device under test (DUT) station 100. DUT station 100 may be one of several testing stations in a semiconductor fabrication facility that are adapted to test functionality of integrated circuits (ICs) produced at the facility. More specifically, after a bin of ICs is produced, an operator at DUT station 100 may select an IC such as IC 110 for testing. If IC 110 is adapted for a "flip-chip" package, the operator may planarize and polish IC 110 to reduce the thickness of the backside substrate to, e.g., between 50 and 200 micrometers. Reducing the thickness of the backside substrate typically does not affect the operation of the IC circuitry but advantageously increases the frequency range of photon emissions that can penetrate the backside substrate. The operator mounts IC 110 in DUT station 100, connecting to IC 110, supply voltages, such as Vdd 120 and Vpica 122, and a testing pattern generator 124. While testing pattern generator 124 applies test vectors to IC 110, a detector 130 monitors photon emissions from IC 110. An imager 140 may then generate a luminescence intensity 142 visible to the operator, based upon the intensity and coordinates of the photon emissions from IC 110. In other embodiments, IC 110 generates Vpica 122 internally from, e.g., Vdd 120.

The operator may match the coordinates of the photon emissions with coordinates of structures within IC 110 and determine whether the structures are functioning correctly. In particular, the operator may anticipate switching events by structures of IC 110 and compare the anticipated switching events against the timing and intensity of the photon emissions from corresponding structures of IC 110. For example, if the operator notices that a register file within IC 110 emits an intensity of photons for a longer period of time than other, adjacent register files, the register file may be faulty. Further, if the operator detects this problem with more than one of the ICs in the bin, the operator may advantageously instigate corrective measures to prevent the problem from reoccurring in subsequently produced batches of the ICs.

IC 110 is a circuit built on a semiconductor such as a processor, state machine, or other logic. IC 110 includes transistors to implement the logic and other supporting circuitry such as a phase-locked loop circuit to generate a clock signal, local circuitry to repeat the clock signal, error diagnostics circuits, data storage, and etc. IC 110 also includes one or more beacons such as beacon 112. Beacons are designed to monitor signals and boost the intensity of photon emissions in response those signals. Beacons may be strategically located within IC 110 to monitor signals of interest during testing or debugging phases of the design and production of IC 110.

Figure 2:
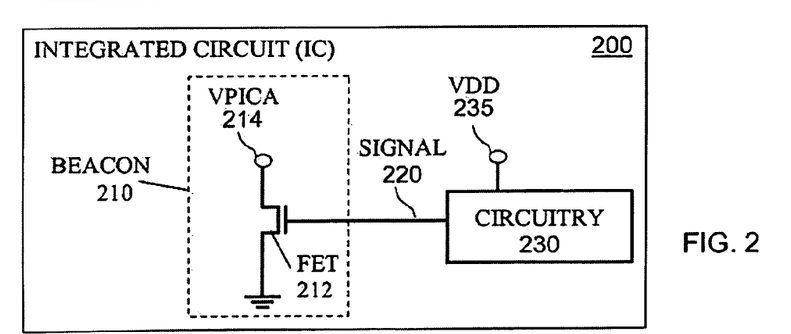
FIG. 2 depicts a circuit diagram of an embodiment of a beacon incorporated into an integrated circuit (IC)

As an illustration, FIG. 2 depicts IC 200, which is a more detailed embodiment of IC 110. IC 200 includes a beacon 210 and circuitry 230. Beacon 210 couples the channel of a field-effect transistor (FET) 212 between Vpica 214 and ground. In some embodiments, Vpica 214 may be supplied from an external supply voltage such as Vpica 122 in FIG. 1. In other embodiments, IC 200 may generate Vpica 214 based upon a supply voltage such as Vdd 235.

Circuitry 230 is a circuit that includes, a signal of interest, signal 220. Designers of IC 200 coupled a beacon with signal 220 for debugging IC 200 and, in some embodiments, for testing the integrity of IC 200 in the field. For example, circuitry 230 may be a central clock buffer, a local clock repeater, a phase-locked loop (PLL) circuit, a logic gate, an inverter, a scanable latch circuit, or any other circuit.

Circuitry 230 is coupled with Vdd 235 to provide a source for signal 220 and is coupled with beacon 210 to transmit signal 220 to the gate of FET 212. Beacon 210 turns on in response to signal 220 when signal 220 attains or surpasses a threshold voltage (Vt) of FET 212. Once turned on, beacon 210 emits an intensity of photons that is linearly related to the current between Vpica 214 and ground in the channel of FET 212. For example, Vpica 214 rather than Vdd 235 may be applied an end of the channel of FET 212 to increase the strength of the electric field for accelerating carriers in the channel. The increase in the strength of the electric field, increases the instance of carriers with kinetic energy in excess of the bandgap energy for the semiconductor, e.g., silicon, upon which IC 200 is built. Provided the carrier does not lose too much kinetic energy by some other interactions, that excess kinetic energy may be applied to the creation of a photon having a frequency directly related to the excess kinetic energy. The increased strength, therefore, increases the average and peak frequencies associated with the photon emissions as well as the number of photons. On the other hand, turning beacon 210 off attenuates the current conducted by the channel of FET 212, which substantially reduces the carriers in the channel, and thereby reduces the intensity of the photon emissions.

Referring back to FIG. 1, DUT station 100 may include one or more power supplies to provide supply voltages, such as Vdd 120 and Vpica 122, to IC 110 for testing. Vdd 120 is a circuit voltage typically applied to channels of transistors of IC 110 for logic operations. Vpica 122 is a second supply voltage that is greater than Vdd 120 to enhance photon emissions from beacons such as beacon 112 of IC 110.

Figure 3:
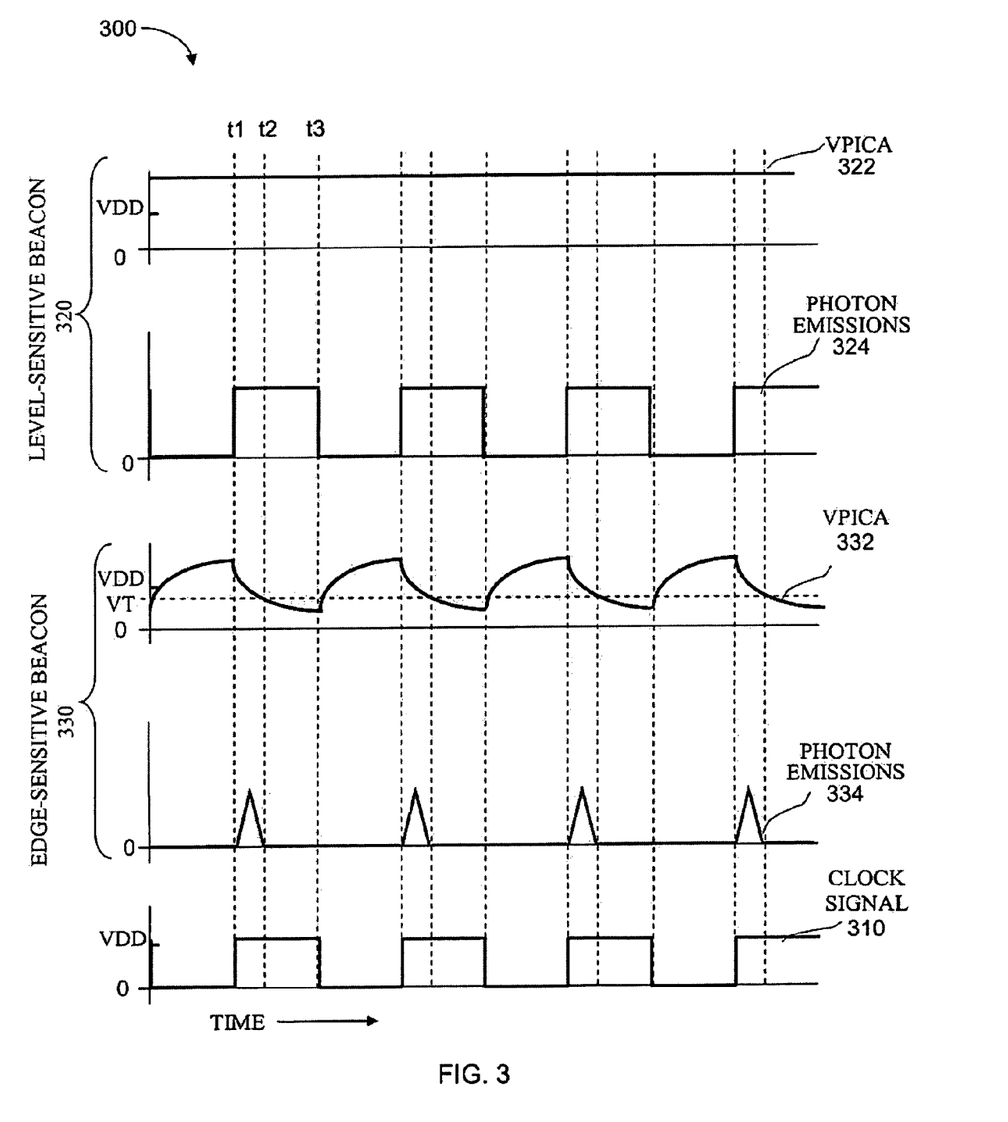
FIG. 3 depicts a timing diagram illustrating differences between an edge-sensitive beacon and a level-sensitive beacon based upon the nature of the power supply for Vpica.

Turning to FIGS. 2 and 3, FIG. 3 is a conceptual timing diagram of voltages across the channel of and photon emissions from beacon 210 to illustrate two embodiments of Vpica 214. Vpica 214 may support a level-sensitive response 320 to clock signal 310 or an edge-sensitive response 330 to clock signal 310 by beacon 210 depending upon the nature of the power source for Vpica 214. More specifically, when the power source for Vpica 322 provides substantially constant voltage and current for beacon 210, beacon 210 outputs substantially constant photon emissions 324 in response to transitions in the level of clock signal 310. For example, the constant magnitude of Vpica 322 between times t1 and t3 facilitates substantially constant photon emissions 324 between times t1 and t3.

On the other hand, the power supply for Vpica 332 may provide a finite charge such as a capacitance, which is discharged in response to a transition of clock signal 310. In many of such embodiments, Vpica 332 discharges in response to a transition of the clock signal 310 as depicted at time t1. When the level of Vpica 332 drops below the threshold voltage Vt, at time t2, photon emissions 334 from beacon 210 substantially end. However, leakage currents associated with beacon 210 or other circuitry of IC 200 may produce photon emissions (not shown). Advantageously, the higher voltage of Vpica 332, can boost photon emissions 324 and 334 associated with signals of interest, above intensities and frequencies of photon emissions associated with leakage currents.

Turning back to FIG. 1, test pattern generator 124 is adapted to generate a series of vectors to test the functionality of IC 110. In particular, test pattern generator 124 may generate one or more patterns of bits and transmit the one or more patterns of bits to IC 110 in parallel and/or in series to initiate different combinations of switching events within IC 110. Beacon 112 monitors one or more of the anticipated switching events and changes state in response. For instance, for a beacon such as beacon 210, FET 212 may transition from on to off and vice versa in response to switching events of circuitry 230 that produce signal 220. Switching events are especially important for generating photon emissions in many low power circuits such as Complementary Metal Oxide Semiconductor (CMOS) circuits. CMOS circuits typically draw current to switch between states and conserve power while the state of the CMOS circuit remains constant. For example, in one embodiment, test pattern generator 124 generates a time-varying test bit pattern to initiate a chain of switching events via scanable latches of IC 110. In a further embodiment, test pattern generator 124 is coupled with imager 140 to monitor the luminescence intensities responsive to test vectors to determine or select subsequent test vectors.

Detector 130 may be adapted to detect photons emissions from IC 110 and, in several embodiments, photon emissions within a specific frequency range and a selected area of IC 110. More specifically, detector 130 may determine coordinates associated with the photon emissions and associate the coordinates with a time index. Detector 130 may then transmit the coordinates and time index to imager 140.

In the present embodiment, detector 130 includes a lens 132 and an imaging microchannel plate photomultiplier (IMPP) 134. Lens 132 is adapted to collect photon emissions, also referred to as hot-carrier light emissions, and direct the photon emissions onto IMPP 134. In many embodiments, lens 132 may be adjusted during testing to adjust the size of the area of IC 110 from which photon emissions are collected. For example, lens 132 may be adjusted to view a large area of IC 110, or even the entire area of IC 110, to obtain a large pattern of photon emissions. The large pattern of photon emissions can then be compared against an image of IC 110 to associate the photon emissions with structures of IC 110. Then, the lens 132 may advantageously be re-focused on a smaller area of IC 110 to provide a greater resolution image for the smaller area.

IMPP 134 includes a photocathode (the input) and a series of microchannel plates between the photocathode and an anode (the output). The photocathode converts an incident photon into a photoelectron. IMPP 134 applies an electric field intensity to the photoelectron as the photoelectron is emitted from the photocathode to the first microchannel plate, forcing the photoelectron or another electron into a channel of the first microchannel plate. Upon entering the channel, the electron is accelerated by an electric field intensity toward the anode, causing collisions with the wall of the channel that multiply the number of electrons by, e.g., one hundred thousand to one million. The electrons form an amplified electron pulse that passes through the microchannel plates. The power supply that provides the bias for the microchannel plates responds with a transient current pulse. Then, detector 130 identifies the transient current pulse to increment a photon count and determine the time indices for the photon emissions.

The amplified electron pulse emerges from the last microchannel plate and reaches the anode at a location, which is spatially localized to the location of the incident photon at the photocathode. Thus, many embodiments utilize a special resistive that facilitates identification of the location at which the electron pulse reaches the anode to determine the coordinates of the photon emission relative to the location of the anode. For example, the anode may include charge sensitive amplifiers to collect the charge and based upon the uniformity of the resistance, IMPP 134 may determine the (x,y) coordinates of the electron pulse as a weighted ratio of the charge collected by each amplifier.

Imager 140 receives the coordinates (x,y) and the time index (t) from detector 130 and displays a visual representation for the operator. The visual representation may include a luminescence intensity directly related to the photon count. In some embodiments, imager 140 may color code the luminescence intensities 142 to visually emphasize stronger luminescence intensities and deemphasize weaker luminescence intensities for the operator. In further embodiments, imager 140 displays the photon counts for a particular area or beacon in a graph as a function of time. In several embodiments, imager 140 stores the coordinates and corresponding time indices (x,y,t) in a storage device such as a hard drive or a flash memory device.

Figure 4:
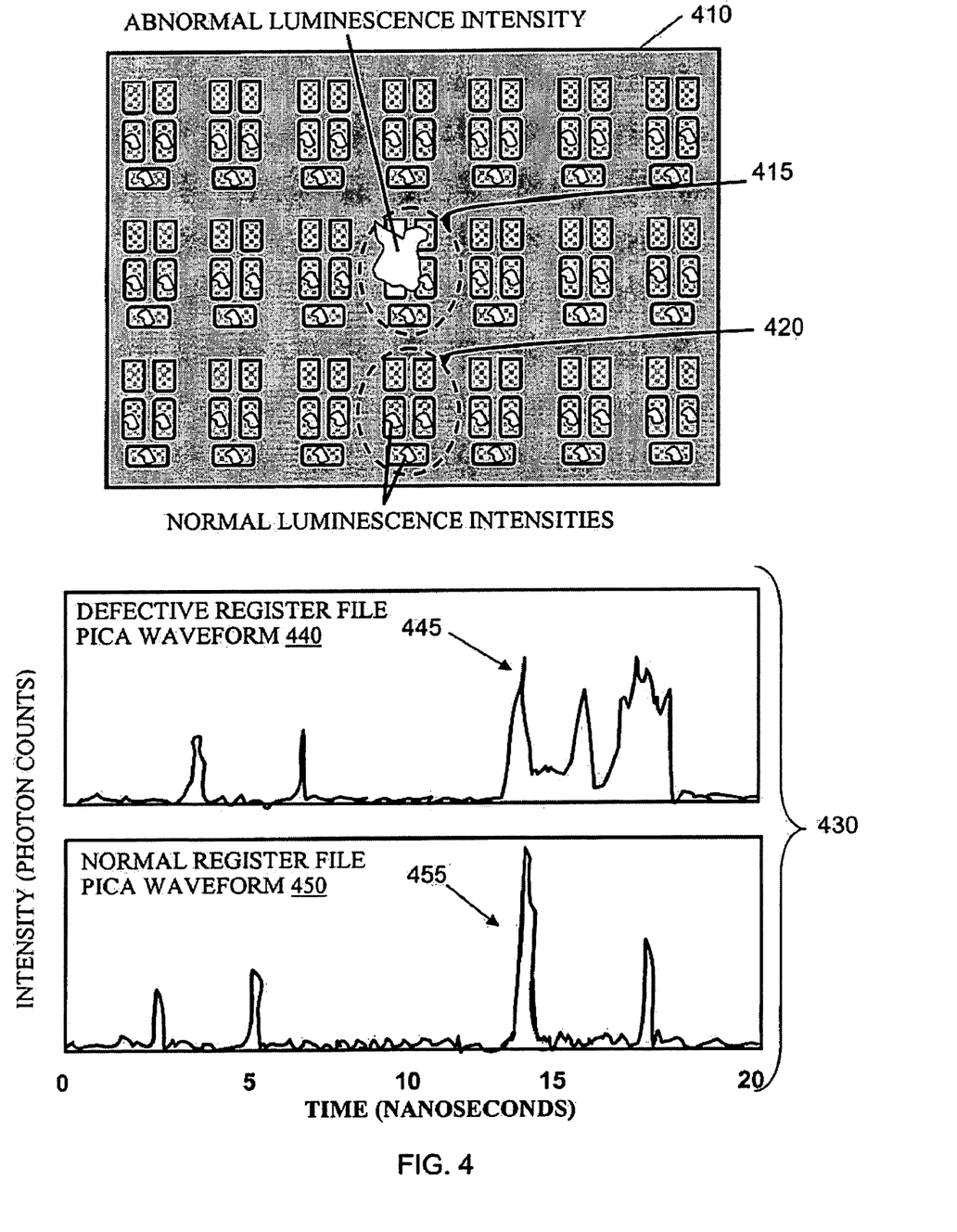
FIG. 4 depicts examples of visual representations generated by the imager from FIG. 1 based upon photon emissions from a defective register file and a normal register file in an IC.

FIG. 4 illustrates two typical types of visual representations that imager 140 may display. In particular, imager 140 may display luminescence intensities in a map view 410 of IC 110 and/or graph optical waveforms 430 for a particular area/or structure of IC 110. In the map. view 410, imager 140 determines luminescence intensities based upon the intensity of photon emissions for coordinates associated with register files as a function of time. In fact, the map view 410 may incrementally change over a period of time to show the changes in intensities of photon emissions within an area in chronological order. Map view 410 depicts one period of time summed over several nanoseconds. A register file 415 has an abnormal luminescence intensity with respect to normal luminescence intensities of other register files such as a register file 420. The abnormal luminescence intensity corresponds to an abnormally high intensity of photon emissions from register file 415, which is linearly related to the current in register file 415. Advantageously, the operator can see the abnormally high current in register file 415 via imager 140.

Optical waveforms 430, also referred to as PICA waveforms, on the other hand, depict graphs of photon counts per unit time for register files of IC 110. PICA waveform 440 shows the photon counts for register file 415 and the photon counts 445 show the same abnormal activity as discussed above. Graph 450 shows the normal photon counts 455 associated with register file 420 over the same period of time.

ICs such as IC 110 typically emit low levels of photons, often referred to as noise, due to leakage currents and other thermal activities. Beacons such as beacon 112 accentuate the photon emissions related to specific signals of interest, which increases the difference between intensities and frequencies of photon emissions associated with the noise, and with the signals of interest. Thus, the luminescence intensities displayed in map view 410 and photon counts displayed in the optical waveforms 430, which result from changes in states of signals of interest, are enhanced.

Figure 5:
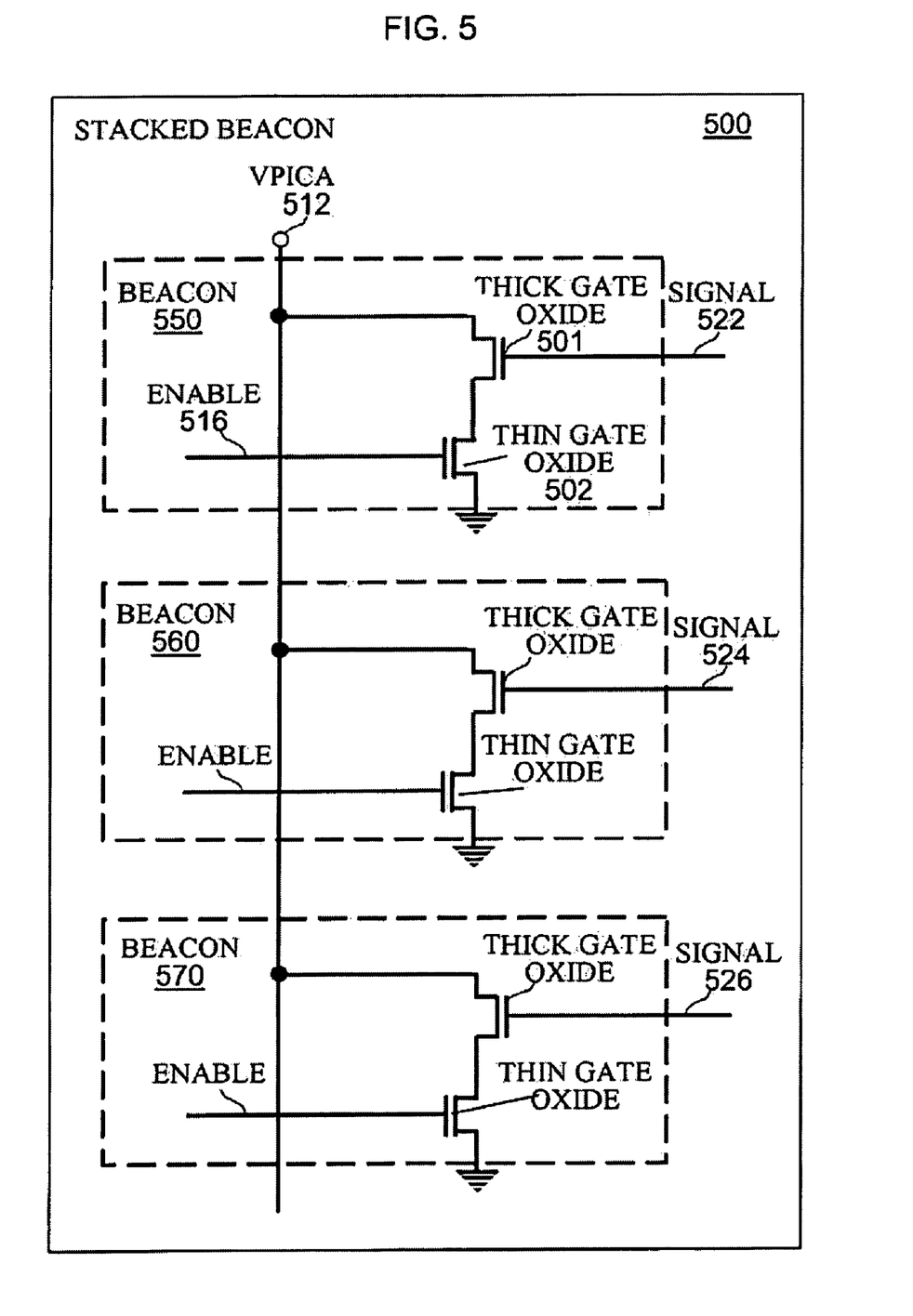
FIG. 5 depicts an embodiment of a stacked beacon to monitor states of multiple input signals.

Referring now to FIG. 5, there is shown an embodiment of a stacked beacon circuit 500 to monitor states of multiple input signals (522,524,526). Stacked beacon circuit 500 includes multiple beacons (550, 560, 570) coupled in parallel with Vpica 512. Beacon 550, for instance, includes a thick gate oxide transistor 501 and a thin gate oxide transistor 502. Thick gate oxide transistor 501 is adapted to emit photons in response to low-to-high voltage level transitions of a signal 522. Thin gate oxide transistor 502 is coupled in series with thick gate oxide transistor 501 between thick gate oxide transistor 501 and a circuit ground to enable and disable beacon 550. For example, when enable 516 is a high voltage, thin gate oxide transistor 502 is turned on. As a result, thick gate oxide transistor 501 turns on, emitting photons at a rate related to the voltage drop across the channel of thick gate oxide transistor 501, when signal 522 has a magnitude that is at least greater than the threshold voltage (Vt) for thick gate oxide transistor 501. And, thick gate oxide transistor 501 turns off when the magnitude of signal 522 drops below Vt for thick gate oxide transistor 501.

A balance of leakage currents between transistors 501 and 502 prevents Vpica 512 from being applied across the channel of transistor 502 when transistor 501 is on and transistor 502 is off. More specifically, as the voltage of signal 522 increases toward Vdd, the gate-to-source voltage (Vgs) of transistor 501 increases until transistor 501 is turned on. When transistor 502 is off, a current from Vpica 512 to the source of transistor 501 increases the voltage at the source of transistor 501 toward Vdd. Once the source's voltage substantially reaches Vdd, however, Vgs of transistor 501 is then substantially zero. Transistor 502, when enabled, attempts to dissipate the charge from the source of transistor 501 to the circuit ground and some balance between Vdd and the circuit ground is reached and maintained at the source of transistor 501.

Alternatively, when transistor 502 is off, a voltage slightly higher than Vdd is reached at the source of transistor 501, based upon a balance between current drawn from Vpica 512 and a subthreshold leakage current dissipated via transistor 502. More specifically, transistor 502 is a thin gate oxide device that has a superior curve when compared with thick gate oxide transistor 501 and more leakage current than the thick gate oxide transistor 501. The two transistors 501 and 502 approach a balance of leakage currents at the source of transistor 501. As the source-to-drain voltage of transistor 501 changes, the current through the channel of transistor 501 increases and the current through the channel of transistor 502 decreases. The two leakage currents then reach a balance at which the voltage is slightly above Vdd. The balance, however, prevents Vpica 512 room being applied across the channel of transistor 502, protecting transistor 502 from damage.

Further, thick gate oxide transistor 501 has a relatively thick gate oxide with respect to thin gate oxide transistor 502 to increase proportion of the voltage drop across the channel of thick gate oxide transistor 501. Increasing the voltage drop across the channel increases the acceleration of carriers in the channel and, thereby, increases the rate and energy levels at which photons are emitted from thick gate oxide transistor 501 in response to signal 522.

Advantageously, thin gate oxide transistor 502 utilizes less silicon area than thick gate oxide transistor 501. Specific design parameters for transistors 501 and 502 are based upon factors such as the allowable loading of the signal 522, allowable silicon area consumed by transistors 501 and 502, desirable increase in photon emissions, and the impact of the beacons 550, 560, and 570 on other parts of the IC.

In the present embodiment, beacons 560 and 570 function in substantially same manner as beacon 550 and have substantially similar constructions. In other embodiments, beacons 560 and/or 570 may be adapted for the portion of the IC in which they reside.

In an alternate embodiment, transistors 501 and 502 are both thin gate oxide transistors. Transistor 502 is a wide channel transistor that is designed to enable and disable transistor 501. The wide channel increases the voltage drop across the channel of transistor 501 with respect to the channel of transistor 502.

In one embodiment, the number of beacons of stacked beacon 500 that may be enabled at one time depends on the load each beacon draws and the magnitude of the current drawn from Vpica 512. In some embodiments, individual and multiple beacons may be selected based upon, e.g., a chain of abatable latches.

Figure 6:
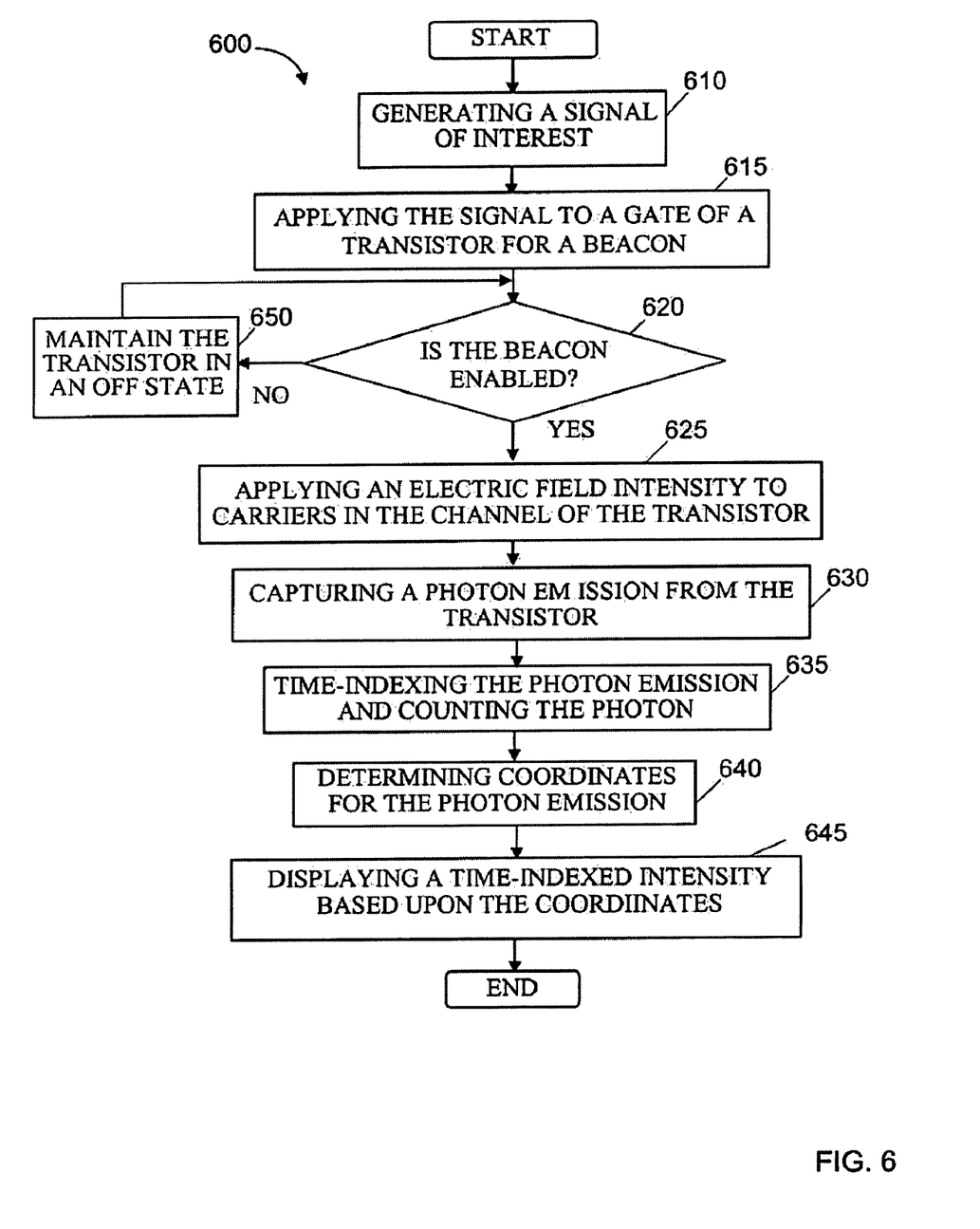
FIG. 6 depicts a flowchart for embodiments to enhance photon emissions from an IC for a signal of interest.

Referring now to FIG. 6, there is shown a flowchart 600 for embodiments that enhance photon emissions responsive to a signal and generate a visual representation of the photon emissions for an operator. Flow chart 600 begins by generating the signal of interest within an integrated circuit (IC) (element 610). For example, the IC may be a processor and the signal of interest maybe a signal generated within a circuit of the processor such as, a phase-locked loop for the primary clock of the processor, a local, clock repeater circuit, or some other critical path circuit that the designers of the processor determined to be of interest during debug phases of testing and production for the processor.

The circuit applies the signal to the gate of a transistor for a beacon (element 615) through one or more conductors in metallization layers of the processor. The beacon is a circuit incorporated into the design of the processor to enhance photon emissions responsive to the signal of interest. In the present embodiment, the beacon includes a transistor having a channel coupled between a high-level supply voltage, Vpica, and a low-level supply voltage such as a circuit ground. An enablement device is placed in series with the transistor to enable and disable the beacon.

When the beacon is not enabled (element 620), the beacon is maintained in an off state (element 650). In the off state, the beacon is designed to substantially remain non-responsive to the signal. However, in some embodiments, transient currents through the transistor's channel may result from transitions in the state of the signal and those transient currents may emit photons. Further, leakage currents in the transistor and the enablement device may also emit photons.

On the other hand, when the beacon is enabled (element 620), an electric field intensity is applied to carriers in the channel of the transistor (element 625). More specifically, while the beacon is enabled, a relatively strong electric field, which has an intensity greater than the maximum rail of the signal, is applied to carriers in the channel. The strong electric field is based upon a proportion of Vpica applied to the channel. The strength of the electric field is designed to accelerate the carriers increasing the kinetic energy of the carriers, and, thereby, increasing the number of carriers that will attain a kinetic energy in excess of the bandgap energy of the channel. Such carriers are more likely to emit a photon during passage through the channel. For example, Vpica may be twice the voltage of Vdd, which is the rail voltage for the signal. When the ratio of impedances between the channel of the transistor and the enablement device is 3:1, the voltage drop across the channel of the transistor may be approximately two-thirds of Vpica. In many embodiments, the voltage drop across the channel is greater than Vdd.

After a photon is emitted from the channel, a detector captures the photon (element 630). In several embodiments, a lens redirects the photon onto a photocathode of the detector. Capturing the photon triggers a transient current. The detector then determines a time index for the photon emission and increments a photon count based upon that transient current (element 635). Further, the detector determines the location of the photon emission based upon the location on the photocathode at which the photon hits the photocathode (element 640). For example, the photocathode may convert the photon into a photoelectron. The detector may amplify the photoelectron to produce an electron pulse on an anode of the detector at a location directly related to the location of the incident photon on the photocathode. A charge collection system for the anode may then determine the location at which the electron pulse hit the anode based upon a weighted proportion of the charge collected at, e.g., four corners of the anode.

Once the detector determines the count, coordinates, and time indices associated with photon emissions from the transistor, this data may be stored in a storage device such as a buffer. An imager may then display a time-indexed photon emission intensity based upon the coordinates of the photon emissions (element 645). In many embodiments, an optical waveform may be displayed for the beacon, which describes the intensity of photon emissions over a period of time. In further embodiments, a display may show the photon emissions of more than one beacon within a selected area of the IC.

It will be apparent to those skilled in the art having the benefit of this disclosure, that the present invention contemplates methods and arrangements to enhance photon emissions responsive to a signal of an integrated circuit by coupling a beacon to the signal. It is understood that the form of the invention shown and described in the detailed description and the drawings are to be taken merely as examples. It is intended that the following claims be interpreted broadly to embrace all the variations of the example embodiments disclosed.

What is claimed is:

1. An integrated circuit to enhance photon emissions responsive to an input signal within the integrated circuit, the integrated circuit comprising:

circuitry to generate the input signal based upon an operable circuit voltage, the circuitry being coupled with a conductor of the integrated circuit, to apply the input signal to the conductor while the integrated circuit is operating, wherein the input signal has a magnitude at or less than the operable circuit voltage; and a beacon coupled with the circuitry at the conductor to generate photon emissions in response to the input signal while enabled and to substantially remain non-responsive to the input signal while disabled, wherein the beacon comprises:

a first transistor having a first channel to couple with a second supply voltage at a first end of the first channel and having a first gate coupled with the conductor, to accelerate carriers through the first channel in response to the input signal, wherein the second supply voltage is materially greater in magnitude than the operable circuit voltage to generate the photon emissions via the carriers; and a second transistor coupled with a second end of the first channel between the first channel and a low circuit voltage, wherein the second transistor comprises a second gate to couple with an enablement signal to enable or disable the beacon;

wherein an impedance of the first transistor is materially greater than an impedance of the second transistor to increase voltage drop across the first channel of the first transistor with respect to voltage drop across the second channel of the second transistor;

wherein the first transistor comprises a thick oxide transistor and the second transistor comprises a thin oxide transistor;

the integrated circuit to couple the circuitry with a first external power supply to supply the operable circuit voltage; and the integrated circuit to couple the first end of the channel of the first transistor with a second external power supply to supply the second supply voltage, the second external power supply being distinct from the first external power supply.

2. The integrated circuit of claim 1, wherein the second channel of the second transistor is coupled in series with the first channel of the first transistor between the second voltage supply and a circuit ground, the circuit ground being the low circuit voltage.

3. The integrated circuit of claim 1, wherein the second power supply is a finite charge power source that facilitates an edge-sensitive response to the input signal by the first transistor.

4. The integrated circuit of claim 1, wherein the second power supply is adapted to provide a constant voltage and current to facilitate a level-sensitive response to the input signal by the first transistor.

5. The integrated circuit of claim 1, wherein the circuitry is adapted to modulate the input signal based upon receipt of a test vector by the integrated circuit to transition the first transistor between states, wherein one of the states attenuates current in the first channel, substantially reducing the carriers in the first channel.

6. The integrated circuit of claim 1, wherein the circuitry is a complimentary metal oxide semiconductor (CMOS) circuit.

7. The integrated circuit of claim 1, wherein the first transistor is a field effect transistor.

8. A system to non-invasively probe states of a input signal, the system comprising:

an integrated circuit comprising circuitry to generate the input signal based upon an operable circuit voltage and, coupled with a conductor of the integrated circuit to apply the input signal to the conductor of the integrated circuit while the integrated circuit is operating, wherein the input signal has a magnitude at or less than the operable circuit voltage; and a beacon coupled with the circuitry at the conductor to generate photon, emissions in response to the input signal while enabled and to substantially remain non-responsive to the input signal while disabled, wherein the beacon comprises:

a first transistor having a channel to couple with a second supply voltage at a first end of the channel and having a gate coupled with the conductor, to conduct current in response to the input signal, wherein the second supply voltage is materially greater in magnitude than the operable circuit voltage to generate photon emissions via carriers of the current; and a second transistor coupled with a second end of the channel between the channel and a low circuit voltage, wherein the second transistor comprises a gate to couple with an enablement signal to enable or disable the beacon;

wherein an impedance of the first transistor is materially greater than an impedance of the second transistor to increase the voltage drop across the channel of the first transistor with respect to the second transistor;

a first power supply to couple with the integrated circuit to supply the operable circuit voltage;

a second power supply to couple with the integrated circuit to supply the second supply voltage; and a detector to capture the photon emissions and associate the photon emissions with time indices to monitor activity of the transistor, the activity being indicative of the states of the input signal.

9. The system of claim 8, further comprising an imager coupled with the detector to receive a count of the photon emissions and the corresponding time indices to generate a visual representation of the activity of the first transistor.

10. The system of claim 9, wherein the visual representation comprises an optical waveform to describe the photon emissions as a function of time based upon the photon counts and the corresponding time indices.

11. The system of claim 9, wherein the visual representation comprises a view of the integrated circuit having a luminescence intensity to represent the photon emissions, wherein the luminescence intensity is directly related to the intensity of the photon emissions.

12. The system of claim 11, wherein the visual representation changes over a period of time to describe changes in the intensity of the photon emissions over time.

13. The system of claim 8, wherein the circuitry is adapted to modulate the input signal based upon receipt of a test vector by the integrated circuit to transition the first transistor between states, wherein one of the states attenuates the current, substantially reducing the carriers in the channel.

14. The system of claim 8, wherein the detector, comprises a lens and an imaging microchannel plate photomultiplier, wherein the lens directs the photon emissions onto the photomultiplier and the photomultiplier counts the photon emissions, associates the photon emissions with time indices, and determines locations associated with the photon emissions.

* * * * *